(12) United States Patent
Kwon et al.

(10) Patent No.: US 7,379,351 B2
(45) Date of Patent: May 27, 2008

(54) NON-VOLATILE SEMICONDUCTOR MEMORY AND PROGRAMMING METHOD

(75) Inventors: Oh Suk Kwon, Yongin-si (KR); Dae Seok Byeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 163 days.

(21) Appl. No.: 11/471,541

(22) Filed: Jun. 21, 2006

(65) Prior Publication Data

US 2006/0291292 A1 Dec. 28, 2006

(30) Foreign Application Priority Data

Jun. 24, 2005 (KR) .................. 10-2005-0054753

(51) Int. Cl.
*G11C 7/00* (2006.01)

(52) U.S. Cl. .................. 365/189.06; 365/230.06

(58) Field of Classification Search ........... 365/189.06, 365/230.06, 185.22, 185.17, 185.18

See application file for complete search history.

(56) References Cited

U.S. PATENT DOCUMENTS

| | | | |
|---|---|---|---|
| 6,064,602 A | 5/2000 | Liu | |
| 6,128,231 A * | 10/2000 | Chung | ............ 365/185.23 |
| 7,023,730 B2 * | 4/2006 | Kouno | ............ 365/185.12 |

2005/0265109 A1 * 12/2005 Goda et al. ............ 365/230.06

FOREIGN PATENT DOCUMENTS

| | | |
|---|---|---|
| JP | 10228795 | 8/1998 |
| JP | 2000348494 | 12/2000 |
| KR | 1020040049114 A | 6/2004 |

* cited by examiner

*Primary Examiner*—Vu A. Le
(74) *Attorney, Agent, or Firm*—Volentine & Whitt, PLLC

(57) ABSTRACT

In one aspect, a programming method is provided for a non-volatile semiconductor memory device which includes a plurality of electrically programmable and erasable memory cells, and transmission transistors for providing predetermined voltages to the memory cells. The method includes a primary programming process which includes providing a first program voltage to a selected memory cell to program the selected memory cell, a verify read process which includes reading the selected memory cell to verify a programmed status of the selected memory cell resulting from the primary programming process, and a secondary programming process which includes providing a second program voltage to the selected memory cell so as to reprogram the selected memory cell after the verify read process. During the verify read process, the transmission transistors are continuously gated by a boosted voltage generated during the primary programming process. The boosted voltage has a voltage level which is sufficient to provide the first and second program voltages to the memory cell.

7 Claims, 5 Drawing Sheets

NON-VOLATILE SEMICONDUCTOR MEMORY AND PROGRAMMING METHOD

BACKGROUND OF THE INVENTION

1. Field of the Invention

The present invention is generally related to non-volatile semiconductor memory devices and to methods of programming non-volatile semiconductor memory device.

A claim of priority is made to Korean Patent Application No. 10-2005-54753, filed Jun. 24, 2005, the subject matter of which is incorporated by reference in its entirety.

2. Description of the Related Art

Generally, in a non-volatile semiconductor memory device (e.g., a NAND flash memory device), data is programmed by altering the threshold voltage of a selected memory cell by applying so-called "pass" and "program" voltages to word lines connected to gates of non-volatile memory cells.

FIG. 1 is a diagram showing a conventional non-volatile semiconductor memory device, and FIG. 2 is a voltage-timing diagram showing a sequence of program loops LOOP <0-2> executed by the device of FIG. 1. Each of the of the program loops LOOP <0-2> includes a programming operation T01, T11 and T21, and verify read operation T02, T12 and T22.

As shown in FIG. 1, the conventional non-volatile semiconductor memory device includes a non-volatile memory cell array 10, row decoder 20, a pre-decoder 30, a high voltage generation unit 50, and a page buffer 60.

The non-volatile memory cell array 10 includes a memory cell string connected between a bit line BL and a common source line CSL. More specifically, the memory cell string includes a select transistor ST, a plurality of non-volatile memory cells MC<1-32>, and a ground transistor GT, all connected in series between the bit line BL and the common source line CSL.

The row decoder 20 includes a boosting circuit 21 and a plurality of transmission transistors TT. One of the transmission transistors TT is connected between a global string select line GSSL and a string select line SSL, and another of the transmission transistors TT is connected between a global ground select line GGSL and a string ground select line SGSL. The remaining transmission transistors TT are respectively connected between global word lines <1-32> and word lines SWL <1-32>. The boosting circuit 21 provides the block gating signal BKWL of FIG. 2 to the gates of the transmission transistors TT in accordance with pass and program voltages VPASS and VPGM, a block address BKADD and a boosting control signal CON11.

The high voltage generation unit 50 generates the pass voltage VPASS and the program voltage VPGM. In addition, although not shown in FIG. 1, the high voltage generation unit 50 generates a read voltage (VREAD, FIG. 2) which is used by the during reading of the non-volatile memory device.

The pre-decoder 30 provides voltages to select one of the global word lines GWL<1:32>, and to activate a global string select line GSSL, and a global ground select line GGSL. As shown in FIG. 2, a selected word line SWL (SELECTED) corresponding to a selected global word line GWL is applied with a program voltage VPGM <1> in response to the block selection signal BKWL, and the non-volatile memory cell connected to the selected word line SWL (SELECTED) is programmed accordingly. The remaining word lines SWL (NON-SELECTED) are applied with the pass voltage VPASS in response to the block selection signal BKWL.

The page buffer 60 senses the voltage of the bit line BL and outputs the voltage to an element external to the memory device, and/or provides the bit line BL with operational voltages received from an external source.

In the conventional non-volatile semiconductor memory device, the voltage level of the block gating signal BKWL is adjusted in accordance with a boosting method. As shown in FIG. 2, throughout a programming process the voltage level of the block gating signal BKWL during a programming operation is greater than the voltage level of the block gating signal BKWL during a preceding programming operation (except for the first programming operation, which has no preceding programming operation). Therefore, the conventional non-volatile semiconductor memory device suffers a drawback in that the voltage level of the block gating signal BKWL is unstable and difficult to control.

Further, in the conventional non-volatile semiconductor memory device, at the starting point of each programming operation 61, 71, and 81, and each verify read operation 62, 72, and 82, the block gating signal BKWL is discharged to a ground voltage VSS. Therefore, the conventional non-volatile semiconductor memory device suffers another drawback in that unnecessary current is consumed and/or a data programming time is increased.

SUMMARY OF THE INVENTION

According to one aspect of the present invention, a programming method is provided for a non-volatile semiconductor memory device which includes a plurality of electrically programmable and erasable memory cells, and transmission transistors for providing predetermined voltages to the memory cells. The method includes a primary programming process which includes providing a first program voltage to a selected memory cell to program the selected memory cell, a verify read process which includes reading the selected memory cell to verify a programmed status of the selected memory cell resulting from the primary programming process, and a secondary programming process which includes providing a second program voltage to the selected memory cell so as to reprogram the selected memory cell after the verify read process. During the verify read process, the transmission transistors are continuously gated by a boosted voltage generated during the primary programming process. The boosted voltage has a voltage level which is sufficient to provide the first and second program voltages to the memory cell.

According to another aspect of the present invention, a programming method is provided for a non-volatile semiconductor memory device which includes a plurality of electrically programmable and erasable memory cells, and transmission transistors for providing predetermined voltages to the memory cells. The method includes a primary programming process which includes providing a first program voltage to a selected memory cell to program the selected memory cell, a verify read process which includes reading the selected memory cell to verify a programmed status of the selected memory cell resulting from the primary programming process, and a secondary programming process which includes providing a second program voltage to the selected memory cell so as to reprogram the selected memory cell after the verify read process. During the secondary programming process, the transmission transistors are continuously gated by a boosted voltage generated during the verify read process. The boosted voltage having a voltage level which is sufficient to provide the first and second program voltages to the memory cell.

According to yet another aspect of the present invention, a non-volatile semiconductor memory device is provided which includes a bit line, a memory array including a plurality of memory cells electrically connected to the bit line, each memory cell having a threshold voltage that is programmable in response a program voltage applied to a word line connected to the memory cell, a row decoder for providing the program voltage a selected word line to program a selected memory cell connected to the selected word line, and a boosted voltage generation unit for generating a boosted voltage which is higher than a maximum value of the program voltage. The row decoder includes a plurality of transmission transistors for providing voltages to respective word lines, and a boosted voltage switching unit which is driven to continuously provide the boosted voltage to gate terminals of the transmission transistors during programming and verify read operations.

BRIEF DESCRIPTION OF THE DRAWINGS

Exemplary embodiments of the present invention will be described in detail with reference to the accompanying drawings, in which like reference numerals are used throughout the drawings to indicate the like or similar components. In the drawings.

DESCRIPTION OF EXEMPLARY EMBODIMENTS

Figure 1:
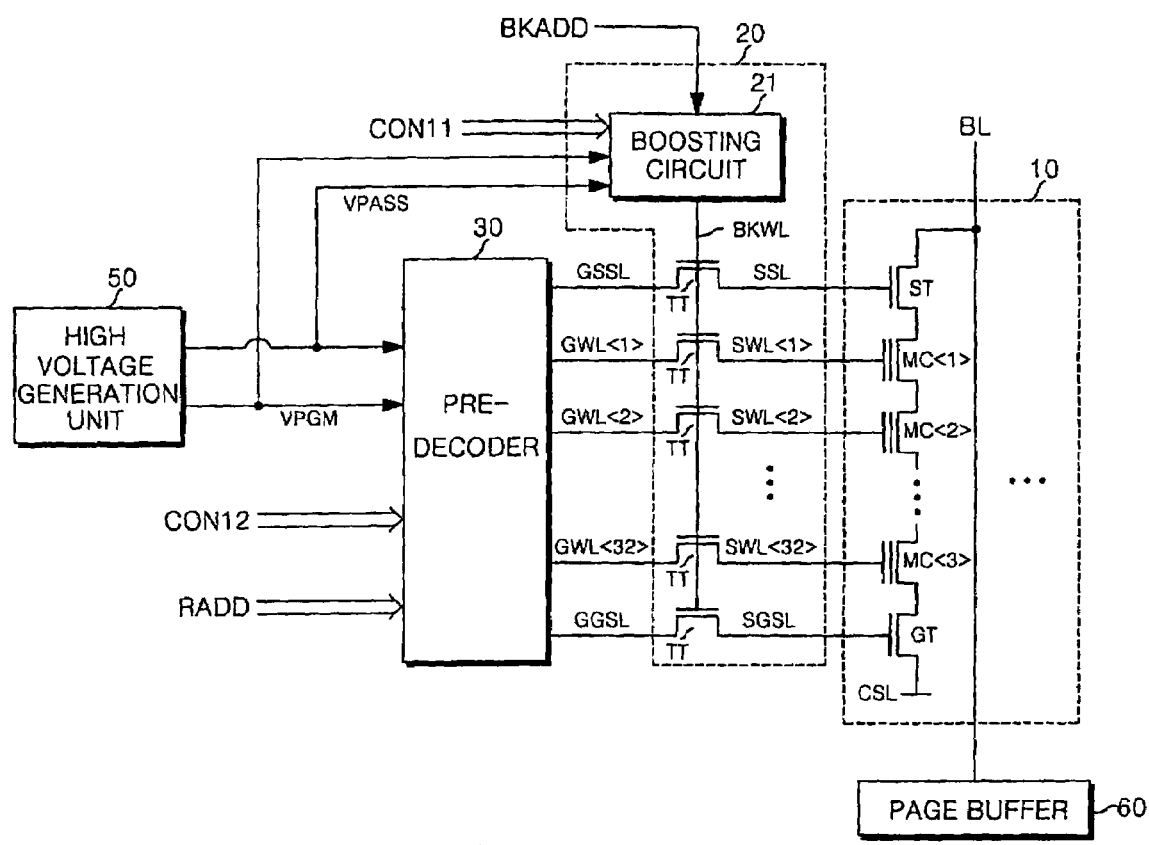
FIG. 1 is a diagram showing a conventional non-volatile semiconductor memory device.
Figure 2:
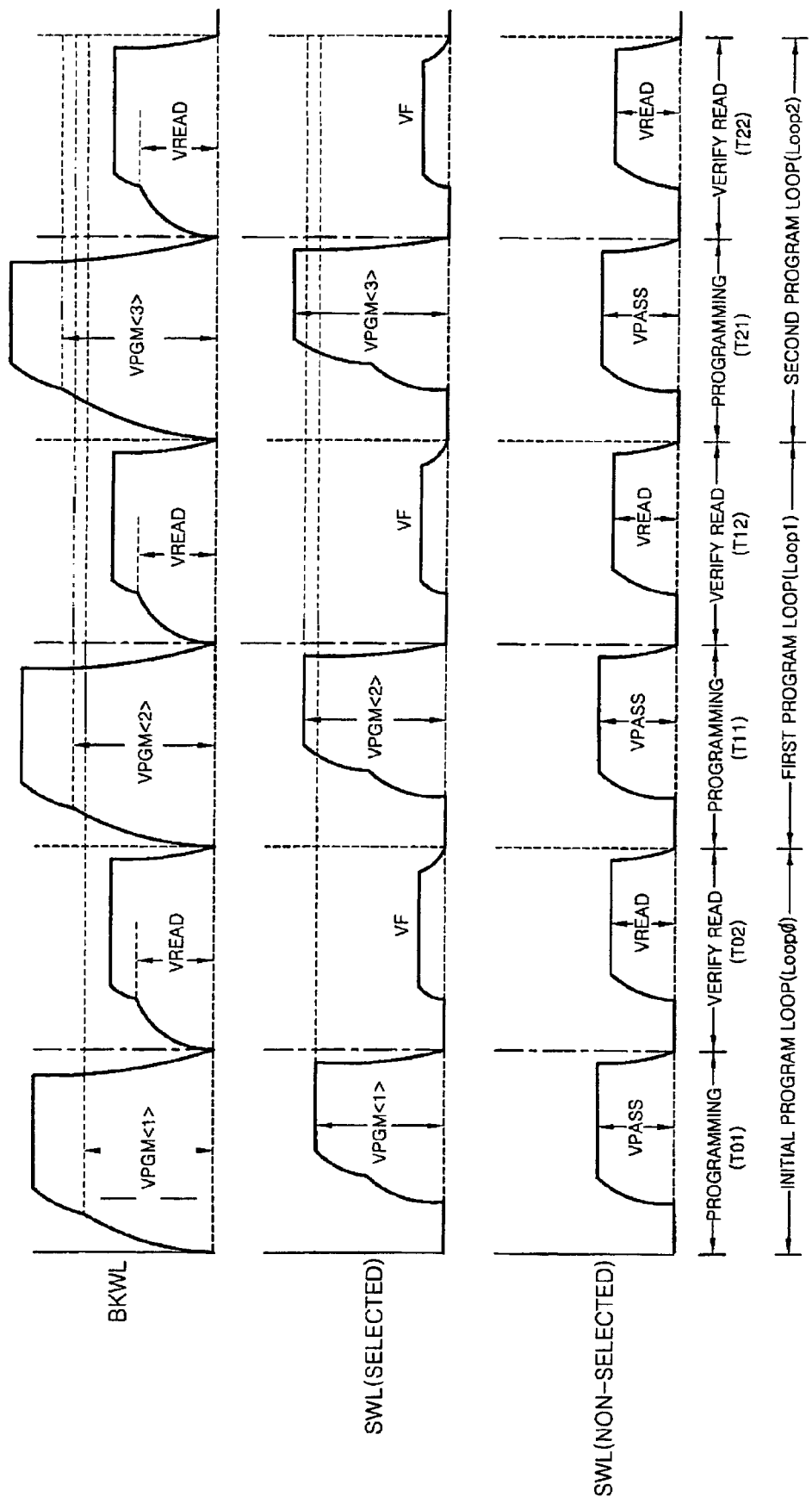
FIG. 2 is a voltage-timing diagram showing a sequence of program loops executed by the device of FIG. 1.
Figure 3:
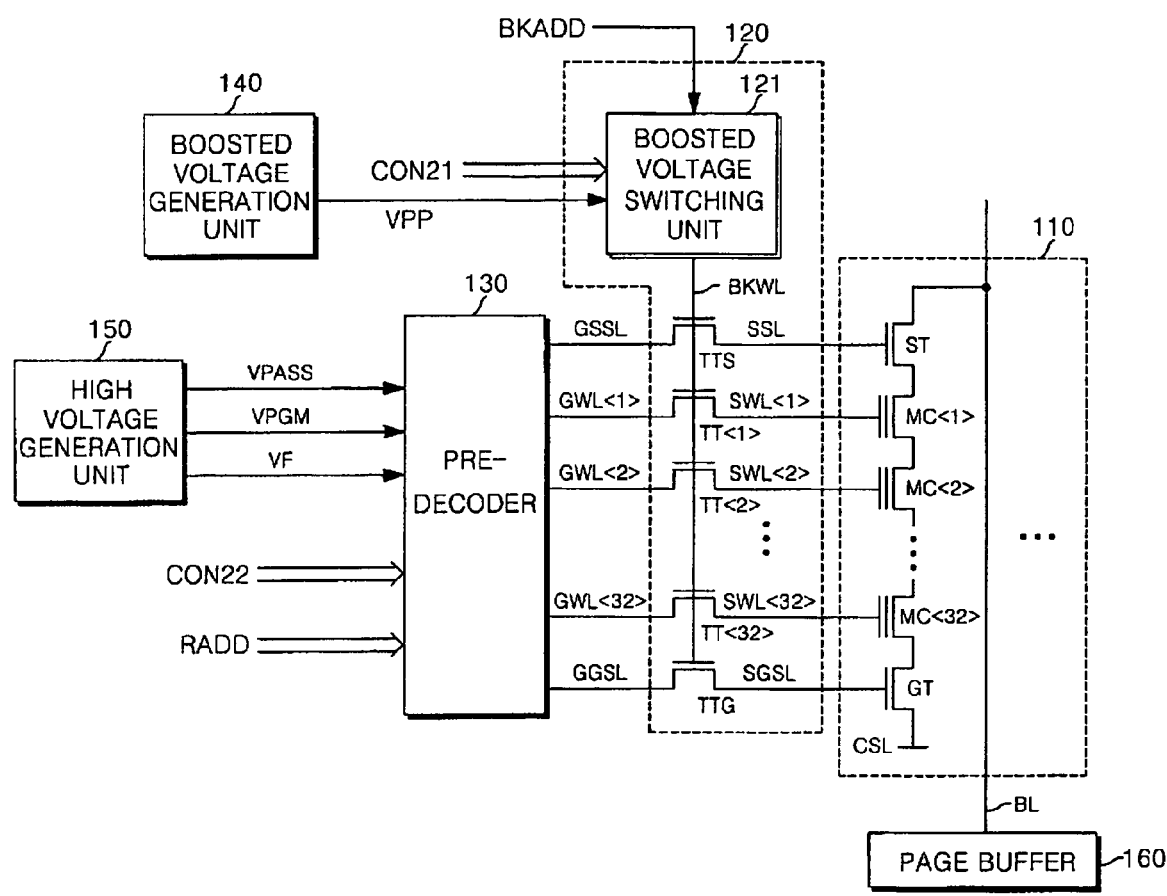
FIG. 3 is a diagram showing a non-volatile semiconductor memory device in accordance with an exemplary embodiment of the present invention.

FIG. 3 is a diagram showing a non-volatile semiconductor memory device in accordance with an exemplary embodiment of the present invention. Referring to FIG. 3, the exemplary embodiment of the non-volatile semiconductor memory device includes a bit line BL, a memory array 110, a row decoder 120, a pre-decoder 130, a boosted voltage generation circuit 140, and a high voltage generation circuit 150.

The memory array 110 comprises a plurality of memory cells MC connected in series to the bit line BL. While the number of memory cells MC connected to a single bit line BL may vary, 32 memory cells MC are connected to the bit line BL in the exemplary embodiment illustrated in FIG. 3 and described in the present specification. The individual memory cells MC, cell word lines SWL, and global word lines GWL of FIG. 3 may be referred to individually using the reference symbols MC<1> through MC<32>, SLW<1> through SWL<32>, and GWL<1> through GWL<32>, respectively, and may be referred to collectively as MC<1:32>, SWL<1:32>, and GWL<1:32>, respectively. For convenience of description, a memory cell MC<1> of this exemplary embodiment will be assumed to be a selected memory cell, though the present invention is not limited to this assumption.

Figure 4:
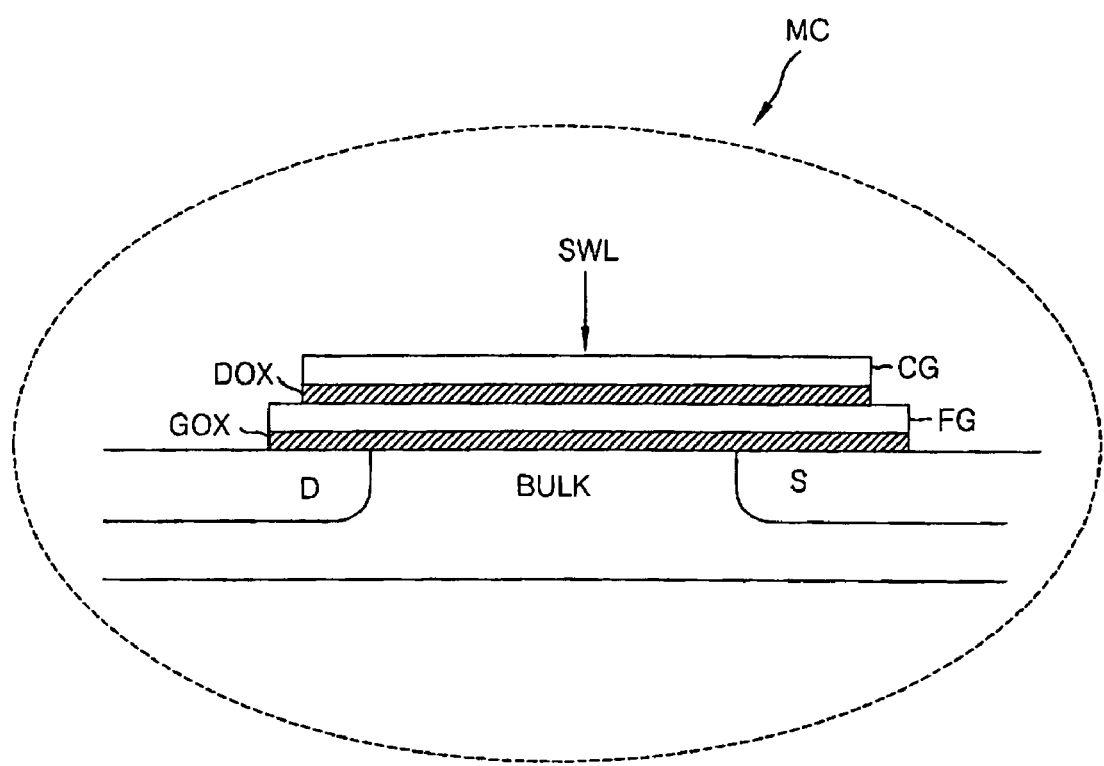
FIG. 4 illustrates an exemplary embodiment of a memory cell MC of FIG. 3.

As shown in FIG. 4, each memory cell MC comprises a current path formed between a source region S and a drain region D on a semiconductor wafer, a floating gate FG formed between a dielectric oxide layer DOX and a gate oxide layer GOX, and a control gate CG. The floating gate FG traps electrons, and the threshold voltage of the memory cell MC corresponds to the number of electrons trapped by the floating gate FG. In this exemplary embodiment, the threshold voltage of a memory cell MC can be controlled in accordance with the voltage provided to the memory cell MC through the corresponding cell word line SWL. Further, when the non-volatile semiconductor memory device performs a read operation, the threshold voltage of a memory cell MC is sensed in order to determine the data value stored in the memory cell.

Further, in each memory cell MC, a programming operation and an erase operation can be performed repeatedly. Various actions are performed on the memory cell MC in accordance with the voltages provided to it. When a memory cell MC is programmed, electrons move to the floating gate FG of the memory cell MC. The electrons may be moved to the floating gate FG using Fowler-Nordheim tunneling (FN tunneling), electron injection, etc. Electron injection can be accomplished through channel hot-electron injection (CHE), channel-initiated secondary electron injection (CISEI), etc. Further, FN tunneling can be effectively used in flash memory devices in which all data is erased at once.

Referring back to FIG. 3, the row decoder 120 provides the voltages on the global string line GSSL, the global word lines GWL<1:32>, and the global ground line GGSL to the cell string line SSL, the cell word lines SWL<1:32>, and the cell ground line SGSL, respectively. In this exemplary embodiment, when a programming operation is performed, the row decoder 120 provides a program voltage VPGM, which is on the global word line GWL<1>, from the global word line GWL<1> to the cell word line SWL<1>, wherein the global word line GWL<1> and the cell word line SWL<1> each correspond to the selected memory cell MC<1>. Further, the cell string line SSL and the cell ground line SGSL gate the string select transistor ST and the ground select transistor GT, respectively, and the cell word lines SWL<1:32> may provide voltages to the memory cells MC<1:32>. Memory array 110 comprises the string select transistor ST, the memory cells MC<1:32>, and the ground select transistor GT.

In this exemplary embodiment, the high voltage generation unit 150 generates the program voltage VPGM and provides it to the pre-decoder 130. During the programming process performed on the selected memory cell MC<1>, the program voltage VPGM generated during the programming operation of a program loop is slightly greater than the program voltage VPGM generated during the preceding program loop (except for the first program loop, which has no preceding program loop in the programming process). Further, the memory cell MC<1> is selectively programmed in accordance with the program voltage VPGM.

The row decoder 120 comprises transmission transistors TTS, TT<1:32> (i.e., the transmission transistors TT<1> through TT<32>), and TTG, and a boosted voltage switching unit 121. The transmission transistors TTS, TT<1:32>, and TTG provide voltages on the global string line GSSL, the global word lines GWL<1:32>, and the global ground line GGSL, respectively, to the cell string line SSL, the cell word lines SWL<1:32>, and the cell ground line SGSL, respectively.

A boosted voltage generation unit 140 provides a boosted voltage VPP to the boosted voltage switching unit 121. The level of the boosted voltage VPP is greater than the maximum voltage level of the program voltage VPGM by an amount that is greater than or equal to the threshold voltage of the transmission transistors TT<1:32>. The boosted voltage switching unit 121 generates the block gating signal BKWL and operates in accordance with a block address BKADD and a switching control signal CON21. In this exemplary embodiment, boosted voltage switching unit 121 selects a memory array 110 in accordance with the block address BKADD. The boosted voltage VPP is provided as the block gating signal BKWL in accordance with the switching control signal CON21. The block gating signal BKWL is provided to the gate terminals of the transmission transistors TTS, TT<1:32> and TTG.

In this exemplary embodiment, the block gating signal BKWL is continuously maintained at the voltage level of the boosted voltage VPP during programming and verify read operations performed on the selected memory cell MC<1>. Therefore, the voltages that are on the global word lines GWL<1:32>, which are provided by the pre-decoder 130, can be provided, without a drop in voltage, to the corresponding cell word lines SWL<1:32> through the transmission transistors TT<1:32>.

The pre-decoder 130 receives the pass voltage VPASS, the program voltage VPGM, and a verify read voltage VF from the high voltage generation unit 150. The pass voltage VPASS has a voltage level appropriate for turning on a corresponding memory cell MC without changing the data value stored in the memory cell MC. The verify read voltage VF has a voltage level required to verify whether the threshold voltage of a programmed memory cell MC has been adjusted to a target value.

The pre-decoder 130 operates in accordance with a row address RADD, and a pre-control signal CON22. In accordance with the pre-control signal CON22, the pre-decoder 130 selectively provides the pass voltage VPASS, the program voltage VPGM, the verify read voltage VF, a supply voltage VCC, the ground voltage VSS, etc., to the global string line GSSL, the global ground line GGSL, and the global word lines GWL<1:32> (which are connected to the transmission transistors TT<1:32>).

A page buffer 160 may sense the voltage of the bit line BL and output the bit line voltage to an element external to the memory device, or provide the bit line BL with a voltage received from an external source.

Figure 5:
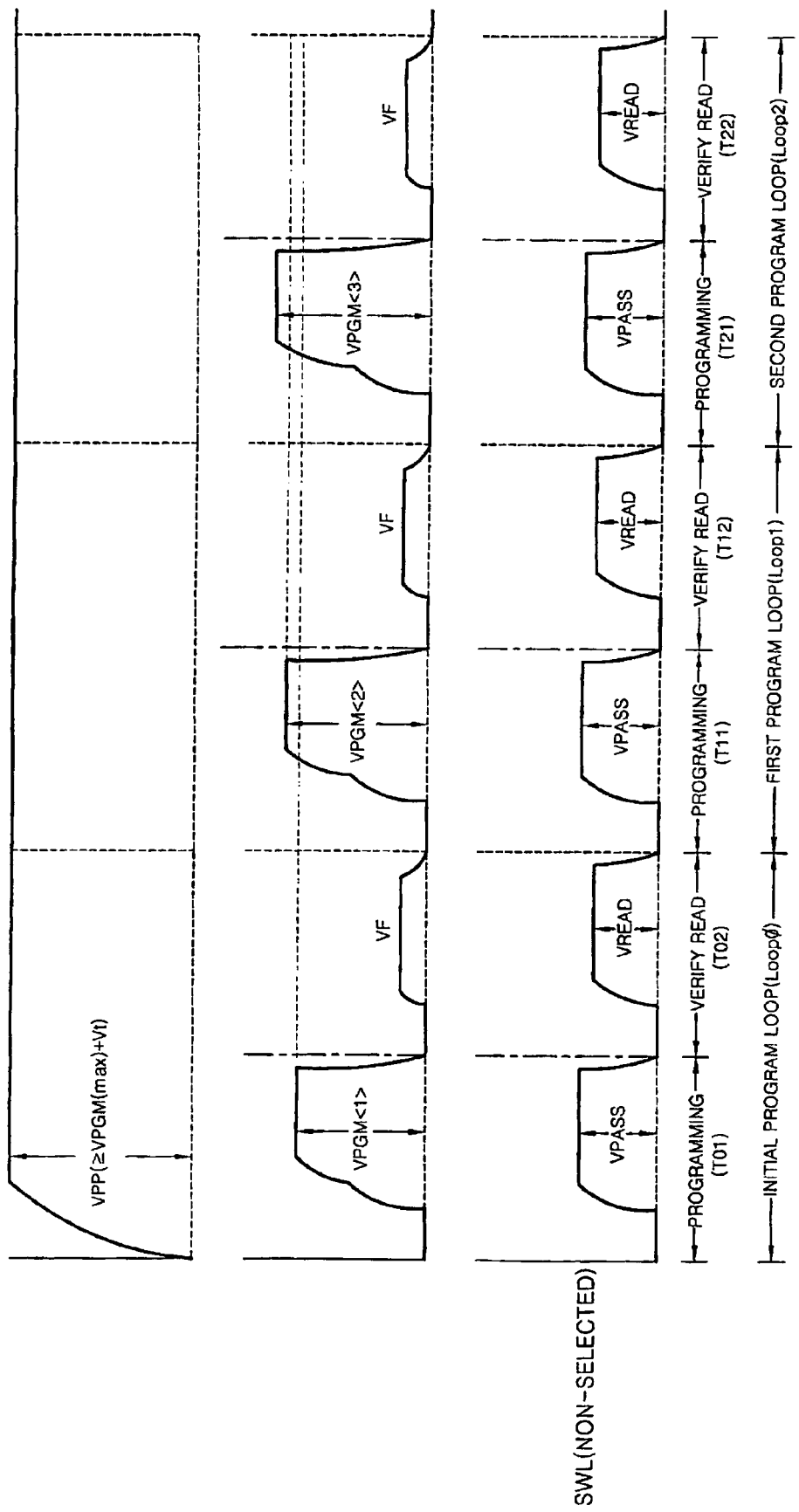
FIG. 5 is a voltage-timing diagram showing a sequence of program loops executed by the device of FIG. 3.

An exemplary programming method for the non-volatile semiconductor memory device of the present invention will now be described with reference to FIG. 5. FIG. 5 is a voltage-timing diagram showing a sequence of program loops LOOP <0-2> executed by the device of FIG. 3. Each of the of the program loops LOOP <0-2> includes a programming operation T01, T11 and T21, and verify read operation T02, T12 and T22.

Each programming operation T101, T111 or T121 is a procedure of providing a program voltage VPGM having a certain level to the memory cell MC<1> so as to increase the threshold voltage of the selected memory cell MC<1>. As shown, the program voltage VPGM is increased with each program loop.

In the present example, during the programming operation T01 of the initial program loop, a voltage that is provided to the memory cell MC<1> to program the selected memory cell MC<1> is designated as a 'first program voltage VPGM<1>'. The programming operation T01 of the inital program loop is designated here as a 'primary programming operation'.

The verify read operations T02, T12 and T22 are procedures for verifying whether the threshold voltages of the memory cell MC<1>, adjusted during respective programming operations T01, T11 and T21, have increased to target values. At this time, if the threshold voltage of the selected memory cell MC<1> is lower than a target threshold voltage, a subsequent program loop is successively executed.

Further, during the verify read operation T02 of the inital program loop, data stored in the selected memory cell MC<1> is read and provided to the bit line BL so as to verify the programmed status of the selected memory cell MC<1> achieved by the primary programming operation T01. In this case, the voltage provided to the memory cell MC<1> is the verify read voltage VF. In the present example, the verify read operation T112 of the inital program loop is designated as a 'verify read operation'.

During the verify read operation T02, if a failure in programming is detected, a subsequent program loop Loop is executed. That is, during the programming operation T11 of the program loop Loop120, a second program voltage VPGM<2> is provided to the selected memory cell MC<1> so as to reprogram the memory cell MC<1>. In the present example, the second program voltage VPGM<2> is higher than the first program voltage VPGM<1> by a certain voltage level. Also in this example, the programming operation T11 is designated as a 'secondary programming operation'.

Referring to FIG. 5, the block gating signal BKWL is maintained at the boosted voltage VPP during the primary programming operation T111, the verify read operation T112 and the secondary programming operation T121. In this case, the boosted voltage VPP has a voltage level sufficient to provide the first and second program voltages VPGM<1> and VPGM<2> to the gate terminal of the memory cell MC<1>, as described above.

Referring to FIG. 5, the block gating signal BKWL maintains the boosted voltage VPP during the primary programming operation T01, the verify read operation T02, and the secondary programming operation T02. The voltage level of boosted voltage VPP is sufficient to provide the first and second program voltages VPGM<1> and VPGM<2> to the gate terminal of the memory cell MC<1> unchanged.

As in the conventional programming method, by the starting point of each of the programming operations, and each of the verify read operations, the cell word line SWL<1> connected to the selected memory cell MC<1> has been discharged to the ground voltage VSS.

In accordance with the non-volatile semiconductor memory device of the present invention and the related programming method, during programming operations T01, T11 and T21, and verify read operations T02, T12 and T22, the block gating signal BKWL, which is provided to the gate terminals of the transmission transistors TT<1:32> (FIG. 3) is continuously maintained at the boosted voltage VPP.

The block gating signal BKWL of embodiments of the present invention has a stable voltage level as compared to the block gating signal BKWL of conventional non-volatile semiconductor memory devices and the conventional programming methods. Further, in accordance with the non-volatile semiconductor memory device of embodiments of the present invention and the related programming methods, the operation of discharging the block gating signal, executed at each programming operation and each verify read operation, is omitted. Therefore, the current consumption and/or the time required for data programming are reduced relative to conventional device non-volatile semiconductor memory devices and conventional programming methods.

Although exemplary embodiments of the present invention have been described, those skilled in the art will appreciate that various modifications, additions and substitutions may be made without departing from the scope of the invention as set forth in the accompanying claims.

What is claimed is:

1. A programming method for a non-volatile semiconductor memory device which includes a plurality of electrically programmable and erasable memory cells, and transmission transistors for providing predetermined voltages to the memory cells, said method comprising:
    a primary programming process which includes providing a first program voltage to a selected memory cell to program the selected memory cell;
    a verify read process which includes reading the selected memory cell to verify a programmed status of the selected memory cell resulting from the primary programming process; and
    a secondary programming process which includes providing a second program voltage to the selected memory cell so as to reprogram the selected memory cell after the verify read process,
    wherein, during the verify read process, the transmission transistors are continuously gated by a boosted voltage generated during the primary programming process, the boosted voltage having a voltage level which is sufficient to provide the first and second program voltages to the memory cell.

2. The programming method according to claim 1, wherein the transmission transistors during the secondary programming process are continuously gated by the boosted voltage generated during the verify read process.

3. The programming method according to claim 2, wherein the secondary programming process further includes discharging the voltage, provided to the selected memory cell, to a ground voltage.

4. The programming method according to claim 1, wherein the verify read process further includes discharging the voltage, provided to the selected memory cell, to a ground voltage.

5. The programming method according to claim 1, wherein the second program voltage is higher than the first program voltage.

6. A programming method for a non-volatile semiconductor memory device which includes a plurality of electrically programmable and erasable memory cells, and transmission transistors for providing predetermined voltages to the memory cells, said method comprising:
    a primary programming process which includes providing a first program voltage to a selected memory cell;
    a verify read process which includes reading the selected memory cell to verify a programmed status of the selected memory cell resulting from the primary programming process; and
    a secondary programming process which includes providing a second program voltage to the selected memory cell so as to reprogram the selected memory cell after the verify read process,
    wherein, during the secondary programming process, the transmission transistors are continuously gated by a boosted voltage generated during the verify read process, the boosted voltage having a voltage level which is sufficient to provide the first and second program voltages to the memory cell.

7. A non-volatile semiconductor memory device, comprising:
    a bit line;
    a memory array including a plurality of memory cells electrically connected to the bit line, each memory cell having a threshold voltage that is programmable in response a program voltage applied to a word line connected to the memory cell;
    a row decoder for providing the program voltage a selected word line to program a selected memory cell connected to the selected word line; and
    a boosted voltage generation unit for generating a boosted voltage which is higher than a maximum value of the program voltage,
    wherein the row decoder comprises,
    a plurality of transmission transistors for providing voltages to respective word lines, and
    a boosted voltage switching unit which is driven to continuously provide the boosted voltage to gate terminals of the transmission transistors during programming and verify read operations.

* * * * *